United States Patent [19]

Kono

[11] Patent Number: 4,947,283

[45] Date of Patent: Aug. 7, 1990

[54] SOLENOID DRIVE CIRCUIT

[75] Inventor: Hiromi Kono, Higashimatsuyama, Japan

[73] Assignee: Diesel Kiki Co., Ltd., Tokyo, Japan

[21] Appl. No.: 216,267

[22] Filed: Jul. 7, 1988

[30] Foreign Application Priority Data

Jul. 10, 1987 [JP] Japan .................. 62-105955[U]

[51] Int. Cl.$^5$ .......................................... H01H 47/32
[52] U.S. Cl. ..................................... 361/154; 323/351; 361/190
[58] Field of Search ............... 361/152, 153, 154, 160, 361/189, 190; 323/287, 351

[56] References Cited

U.S. PATENT DOCUMENTS

| 4,225,898 | 9/1980 | Weber et al. | 361/154 |
| 4,511,945 | 4/1985 | Nielsen | 361/154 |
| 4,520,420 | 5/1985 | Ariyoshi et al. | 361/154 |
| 4,556,925 | 12/1985 | Yanagida | 361/154 |
| 4,599,674 | 7/1986 | Ishikawa et al. | 361/154 |

Primary Examiner—A. D. Pellinen
Assistant Examiner—Jeffrey A. Gaffin

[57] ABSTRACT

A solenoid drive circuit, when providing a holding current to a solenoid by means of periodically turning a drive transistor on and off, by-passes a Zener diode until immediately before the end of a holding period as a result of an on state of a first switching transistor, and interrupts the by-pass of the Zener diode as a result of an off state of the first switching transistor during a time period immediately before the end of the holding period, as above-mentioned, until the lapse of a predetermined time after the end of the holding period. Thereby, current due to a counter-electromotive force is utilized in order to shorten the on time of the drive transistor to thereby save the supply of electric power. Moreover, by interrupting the by-pass of the Zener diode immediately before the end of the holding period, an off-responsibility of current flowing through the solenoid is not disturbed at the end of the holding period.

6 Claims, 2 Drawing Sheets

IN

SOLENOID DRIVE CIRCUIT

BACKGROUND OF THE INVENTION

The present invention relates to a solenoid drive circuit for driving a solenoid valve and the like.

FIG. 1 is a prior art solenoid drive circuit for driving a solenoid valve. A solenoid 1 of the solenoid valve is connected to a power source at a first end, and is grounded via a collecter-emitter circuit of a drive transistor 2 at a second end. A serial circuit of a diode 3 and a Zener diode 4 is inserted in parallel with the solenoid I. A base of the drive transistor 2 is connected via a resistor to an input terminal IN wherein a drive signal for driving the solenoid valve is applied to the input terminal IN.

According to the drive circuit of FIG. 1, an off-responsibility of current flowing through the solenoid 1 rises by existence of the Zener diode 4. However, in the drive circuit of FIG. 1, due to existence of the Zener diode 4, current due to a counter-electromotive force cannot be used as a holding current when a holding current lower than a starting current is to be applied to the solenoid 1 via lowering an average current flowing through the solenoid 1 by turning the drive transistor 2 on and off periodically. Because of this, in the configuration of the circuit of FIG. 1, it is necessary to increase the supply of electric power in order to counteract the shortage due to the inability to utilize the current by counter-electromotive force as the holding current, by extending the on time of the drive transistor 2. That is, as shown in the drawing of FIG. 2, which is explanatory of the operation of the circuit of FIG. 1, current which flows through the solenoid 1, when the drive transistor 2 is changed from on to off, cannot change instantaneously as shown by the full line because of the use of the Zener diode. On the other hand, if the Zener diode 4 does not exist, current by counter-electromotive force flows through the solenoid 1 when the drive transistor 2 is changed from on to off, as shown by the broken line. Therefore, if it is possible to utilize the current by counter-electromotive force as the holding current, it is possible to conserve the supply of electric power during a holding period.

SUMMARY OF THE INVENTION

It is an object, therefore, of the present invention to overcome the disadvantages and limitations of the prior art solenoid drive circuit by providing a new and improved solenoid drive circuit.

Another object of the present invention is to provide a solenoid drive circuit for conserving the supply of electric power without disturbing the off-responsibility of current flowing through a solenoid.

The above objects are attained by a solenoid drive circuit comprising: a drive transistor which is inserted in series with a solenoid and which repeats an on state and an off state in response to a drive signal which is at first level state during a starting period and which repeats periodically the first level state and a second level state during a holding period, said drive transistor being conductive to apply a starting current to said solenoid when said drive signal is in the first level state, and repeating the on state and the off state to provide a holding current, lower than said starting current, to said solenoid when said drive signal repeats the first level state and second level state periodically; a serial circuit of a diode and a Zener diode which is inserted in parallel with said solenoid; and a first switching transistor, which is inserted in parallel with said Zener diode and which repeats an on state and an off state in response to a control signal which is a first level state immediately prior to an end of said holding period and which becomes a second level state after a lapse of a predetermined time after an end of said holding period, said first switching transistor being in the off state to interrupt a by-pass of said Zener diode when said control signal is at the first level state, and being in the on state to by-pass said Zener diode when said control signal is the second level state.

BRIEF DESCRIPTION OF THE DRAWINGS

The foregoing and other objects, features and attendant advantages of the present, invention will become more fully understood from the following description and accompanying drawings which are given by way of illustration only, and thus are not limitative of the present invention, and wherein.

DETAILED DESCRIPTION OF THE INVENTION

Figure 1:
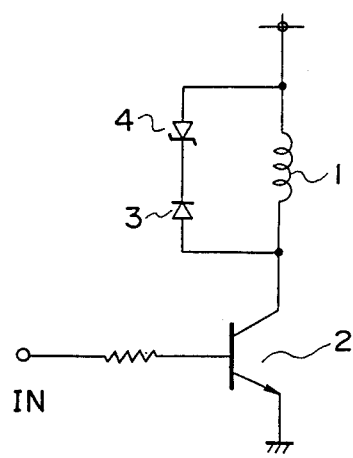
FIG. 1 is a circuit diagram of a solenoid drive circuit of the prior art.
Figure 2:
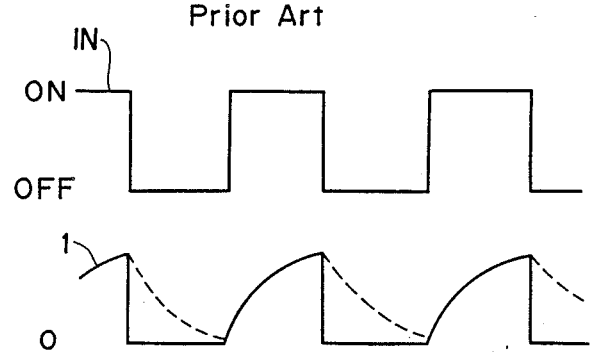
FIG. 2 is an explanatory drawing of the operation of the circuit of FIG. 1.
Figure 3:
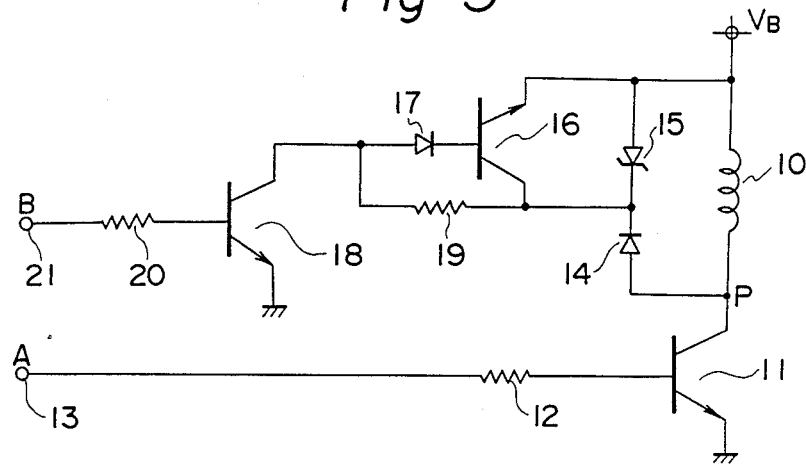
FIG. 3 is a circuit diagram showing an embodiment of a solenoid drive circuit according to the present invention.
Figure 4:
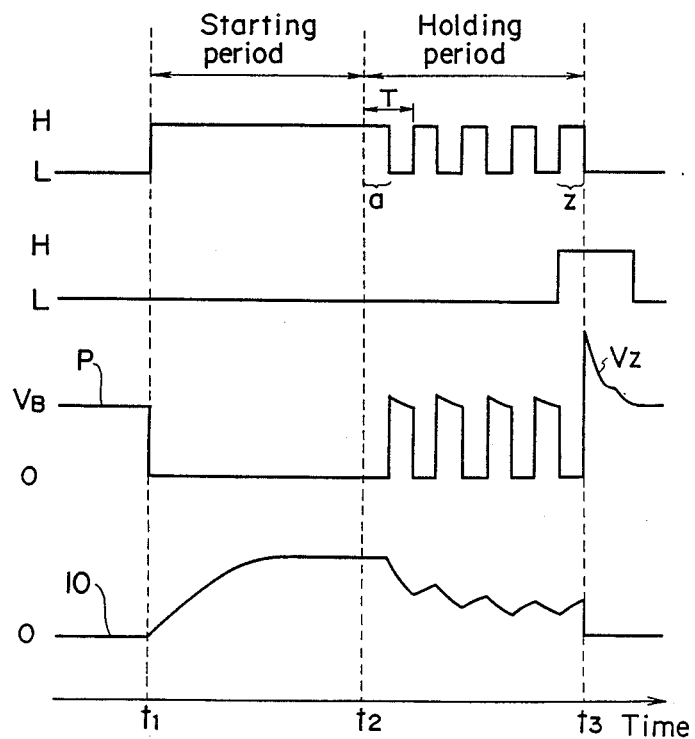
FIG. 4 is a waveform chart for explaining the operation of the circuit of FIG. 3.

In FIG. 3, a reference numeral 10 shows a solenoid in a solenoid valve. The solenoid 10 is connected to a power source VB at a first end and is grounded via a collector-emitter circuit of a drive transistor 11 at a second end. A base of the drive transistor 11 is connected via a resistor 12 to a drive signal input terminal 13. A drive signal applied to the drive signal input terminal 13, as shown by a waveform (A) of FIG. 4, is at a high level during a starting period $t_1$–$t_2$ of the solenoid valve, and repeats the high level and a low level with cycle T during a holding period $t_2$–$t_3$ of the solenoid valve. The drive signal is at the high level during the initial portion of the holding period, a high-level portion (a) of the waveform (A) of FIG. 4, and at the last portion, a high-level portion (z) of the waveform (A) of FIG. 4. The drive transistor 11, following the drive signal applied to the input terminal 13, is in an, on state during the starting period $t_1$–$t_2$ of the solenoid valve and applies a starting current to the solenoid 10, and is turned on and off periodically during the holding period $t_2$–$t_3$ of the solenoid valve and therefore applies a holding current, lower than the starting current, to the solenoid 10.

A serial circuit of a diode 14 and a Zener diode 15 is inserted in parallel with the solenoid 10. A collector-emitter circuit of a first switching transistor 16 is inserted in parallel with the Zener diode 15. A base of the first switching transistor 16 is grounded via a protection diode 17 and collector-emitter circuit of a second switching transistor 18. The base of the first switching transistor 16 is also connected via the protection diode 17 and resistor 19 to a collector of the first switching transistor 16. A base of the second switching transistor 18 is connected via a resistor 20 to a control signal input terminal 21. A control signal applied to the control signal input terminal 21, as shown by a waveform (B) of FIG. 4, inverts from a low level to a high level by synchronizing with the last rising to the high level of the drive signal, a rising edge of a high-level portion z of the waveform (A) of FIG. 4, and returns to the low level after a lapse of a predetermined time after the end of the holding time $t_2-t_3$. The second switching transistor 18 is conductive in a high-level section of the control signal, and is cut off in a low-level section of the control signal. The first switching transistor 16, when the second switching transistor 18 is in off state, is conductive by a counter-electromotive force of the solenoid 10 and by-passes the Zener diode 15, and is cut off when the second switching transistor 18 is in on, state FIG. 4 is a waveform chart for explaining the operation of the circuit of FIG. 3. In FIG. 4, the waveform (A) shows the drive signal applied to the drive signal input terminal 13, the waveform (B) shows the control signal applied to the control signal input terminal 21, a waveform (C) shows a potential at a point P in the circuit of FIG. 3, and a waveform (D) shows a current which flows through the solenoid 10.

When the drive signal assumes the high level at time $t_1$, the drive transistor 11 is conductive, and the starting current flows through the solenoid 10. When the starting period has come to an end at time $t_2$ and the holding period starts, the drive signal starts repeating the high level and low level with cycle T. Because of this, the counter-electromotive force is generated in the solenoid 10. By the counter-electromotive force, the first switching transistor 16 is conductive, and thereby the Zener diode 15 is by-passed. The drive transistor 11 is conductive/cut off in response to the repetition of the high level and low level of the drive signal, and thereby current flowing through the solenoid 10 is lowered. Since the Zener diode 15 is by-passed, current due to the counter-electromotive force flows through the solenoid 10 when the drive transistor 11 is in an off state, and, as shown in the waveform (D), the current by the counter-electromotive force works as the holding current. When the drive signal rises at the last high-level portion (z) of the holding period, the control signal inverts from the low level to the high level synchronously with a rising edge of the last high-level portion (z). As a result of the high level state of the control signal, the second switching transistor 18 is conductive. As a result, the first switching transistor 16 is cut off, and the by-pass of the Zener diode 15 is interrupted. When the holding period comes to an end at time $t_3$, current flowing through the solenoid 10 falls immediately due to generation of a counter-electromotive voltage $V_z$ corresponding to the Zener voltage, as shown by the waveform (C), by existence of the Zener diode 15. Therefore, an off-responsibility of current at the end of the holding period is never disturbed. When the predetermined time passes after the end of the holding period, the control signal returns to the low level in order to be ready for the next operation.

Though the above-mentioned embodiment uses a solenoid valve in the explanation, the present invention is of course applicable extensively to a drive circuit of a solenoid of a relay and other similar devices.

As described above in detail, the solenoid drive circuit according to the present invention, when providing the solenoid the holding current by means of periodic on/off of the drive transistor, by-passes the Zener diode, by means of the on state of the first switching transistor until immediately before the end of the holding period, and interrupts the by-pass of the Zener diode by means of the off state of the first switching transistor, during a period from immediately before the end until the lapse of the predetermined time after the end of the holding period. Because of this, current due to the counter-electromotive force can be utilized as the holding current, and therefore the on time of the drive transistor during the holding period can be shortened to conserve the supply of electric power. Moreover, as the by-pass of the Zener diode is interrupted immediately before the end of the holding period, the off-responsibility of current flowing through the solenoid is not disturbed at the end of the holding time.

From the foregoing, it will now be apparent that a new and improved solenoid drive circuit has been implemented. It should be understood of course that the embodiment is merely illustrative and is not intended to limit the scope of the invention. Reference should be made to the appended claims, therefore, rather than the specification, to determine the scope of the invention.

What is claimed is:

1. A solenoid drive circuit comprising:
   a solenoid, having a first and second end, with said first end connected to a power source;
   a drive transistor, a collector of which is coupled to said second end of said solenoid and an emitter of which is coupled to system ground and which assumes an ON state or an OFF state in response to a drive signal, said drive signal maintaining a first level state during a starting period and periodically alternating between said first level state and a second level state during a holding period, said drive transistor assuming said ON state in response to said first level state of said drive signal and assuming said OFF state in response to said second level state of said drive signal;
   a serial circuit consisting of a diode and a Zener diode inserted in parallel with said solenoid;
   a first switching transistor of which a collector-emitter circuit is coupled in parallel with said Zener diode and of which a base is connected to said collector of said first switching transistor via a protection diode and a resistor, said first switching transistor of an NPN type and switched to an ON state by a counter-electromotive force of said solenoid when said base of said first switching transistor is not grounded; and
   a second switching transistor which grounds the base of said first switching transistor via its collector-emitter circuit, the base of said second switching transistor connected to an input terminal which receives a control signal, said control signal assuming a first voltage state prior to an end of said holding period and returning to a second voltage state after lapse of a predetermined time after the end of said holding period, said second switching transistor assuming an ON state when said control signal is at said first voltage state and assuming an OFF state when said control signal is at a second voltage state, said second switching transistor maintaining said OFF state of said first switching transistor from the time period prior to the end of said holding period to the lapse of said predetermined time after the end of said holding period.

2. A solenoid drive circuit according to claim 1, wherein said control signal, synchronous with the level changes of said drive signal, changes from the second level state to the first level state immediately before the end of said holding period.

3. A solenoid drive circuit, for driving a solenoid which consists of a first end coupled to a power supply and a second end, comprising:
- a drive transistor, including a collector coupled to said second end of said solenoid, an emitter coupled to system ground, and a base coupled to a drive signal, said drive signal consisting of a starting period of a first level state followed by a holding period which alternates between said first level state and a second level state with a specific predetermined cycle T, for allowing current to flow through said solenoid in response to said drive signal of said first level state;

a series circuit of a Zener diode and a diode coupled in parallel with said solenoid via said first and second ends respectively;
- a first NPN switching transistor, including an emitter coupled to said first end of said solenoid and said Zener diode, a collector coupled to a connection point intermediate said Zener diode and said diode of said series circuit, and a base coupled through a protection diode to said collector of said first NPN switching transistor, for selectively providing a bypass path around said Zener diode from said first end of said solenoid to said connection point; and
- a second switching transistor, including an emitter coupled to system ground, a collector coupled to the base of said first NPN switching transistor through said protection diode, and a base coupled to a control signal, for switching said first NPN switching transistor off in response to said control signal assuming a first voltage level in order to interrupt said bypass path,
- said control signal assuming said first voltage level for a time period coinciding with the final transition from said second level state to said first level state of said holding period until a predetermined time lapse after the end of said holding period, whereby current flowing through said solenoid falls immediately due to generation of counter-electromotive voltage corresponding to the Zener voltage of said Zener diode after the end of said holding period.

4. A solenoid drive circuit, for driving a solenoid which consists of a first end coupled to a power supply and a second end, comprising:
- a drive transistor coupled to said second end of said solenoid for allowing current to flow through said solenoid in response to a first level state of a drive signal, whereby said drive signal consists of a starting period of said first level state and a holding period which periodically alternates between said first level state and a second level state;
- a series circuit of a Zener diode and a diode coupled in parallel with said solenoid via said first and second ends respectively;
- a first NPN switching transistor, coupled to said first end of said solenoid and a connection point intermediate said Zener diode and said diode for selectively providing a bypass path around said Zener diode; and
- a second switching transistor, coupled to said first NPN switching transistor for switching said first NPN switching transistor off in order to inhibit said bypass path in response to a first voltage level of a control signal,
- said control signal assuming said first voltage level for a time period extending from the last transition from said second level state to said first level state of said drive signal during said holding period to a predetermined time after the end of said holding period whereby current flowing through said solenoid falls immediately at the end of said holding period.

5. A method of driving a solenoid with a solenoid drive circuit comprising
- a power supply coupled to a first end of said solenoid,
- a drive transistor with a collector coupled to a second end of said solenoid, an emitter coupled to system ground, and a base coupled to a drive signal,
- a series circuit of a Zener diode and a diode coupled in parallel with said first and second ends of said solenoid respectively,
- a first NPN switching transistor with an emitter coupled to said first end of said solenoid, a collector coupled to a connection point intermediate said Zener diode and said diode to said series circuit, and a base coupled through a protection diode to said collector of said first NPN switching transistor, and
- a second switching transistor with an emitter coupled to system ground, a collector coupled to the base of said first NPN switching transistor through said protection diode, and a base coupled to a control signal, said method comprising the steps of:
- driving said drive transistor during a starting period with said drive signal assuming a first level state;
- driving said drive transistor during a holding period with said drive signal alternating periodically between said first level state and a second level state with a predetermined cycle T;
- driving said second switching transistor with said control signal assuming a first voltage level during a time period extending from the final transition of said drive signal from said second level state to said first level state during said holding period until a predetermined time lapse after the end of said holding period to inhibit a bypass path from said first end of said solenoid to said connection point whereby a current flowing through said solenoid falls immediately after the end of said holding period.

6. A method of driving a solenoid with a solenoid drive circuit comprising a power supply coupled to a first end of said solenoid, a drive transistor coupled to a second end of said solenoid, and a series circuit consisting of a Zener diode and a diode coupled to said first and second ends respectively, said method comprising the steps of:
- driving said drive transistor during a starting period with a drive signal of a first level state;
- driving said drive transistor during a holding period with said drive signal alternating periodically between said first level state and a second level state; and
- inhibiting a bypass path of said Zener diode during a period of time extending from the last transition from said second level state to said first level state of said drive signal during said holding period to a predetermined time lapse after the end of said holding period whereby current flowing through said solenoid falls immediately due to generation of counter-electromotive voltage corresponding to the Zener voltage of said Zener diode at the end of said holding period.

* * * * *